United States Patent
Blank et al.

(10) Patent No.: US 7,833,862 B2
(45) Date of Patent: Nov. 16, 2010

(54) SEMICONDUCTOR DEVICE AND METHOD FOR FORMING SAME

(75) Inventors: Oliver Blank, Freising (DE); Uli Hiller, Bad Abbach (DE); Maximilian Roesch, St. Magdalen (AT); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 108 days.

(21) Appl. No.: 12/041,391

(22) Filed: Mar. 3, 2008

(65) Prior Publication Data

US 2009/0218618 A1 Sep. 3, 2009

(51) Int. Cl.
*H01L 21/336* (2006.01)
(52) U.S. Cl. .............................. 438/270; 257/E21.626; 257/E21.64
(58) Field of Classification Search .................. 438/268, 438/270, 589; 257/330, E21.626, E21.64
See application file for complete search history.

(56) References Cited

U.S. PATENT DOCUMENTS

| 5,126,807 | A | 6/1992 | Baba et al. |
| 5,326,711 | A | 7/1994 | Malhi |
| 2006/0281249 | A1* | 12/2006 | Yilmaz et al. ............... 438/243 |
| 2007/0114600 | A1 | 5/2007 | Hirler et al. |
| 2009/0050959 | A1* | 2/2009 | Madson ...................... 257/332 |

FOREIGN PATENT DOCUMENTS

| DE | 10234996 A1 | 10/2003 |
| DE | 202004021352 | 8/2007 |

* cited by examiner

*Primary Examiner*—Quoc D Hoang
(74) *Attorney, Agent, or Firm*—Dicke, Billig & Czaja, PLLC

(57) ABSTRACT

A semiconductor device and method. One embodiments provides a semiconductor substrate having a trench with a sidewall isolation comprising a first isolating material, a field electrode formed in lower portion of the trench, a cover comprising a second material above the field electrode, the second material being selectively etchable to the first isolating material, a gate dielectric on the sidewall in an upper portion of the trench and a gate electrode in the upper portion of the trench.

12 Claims, 10 Drawing Sheets

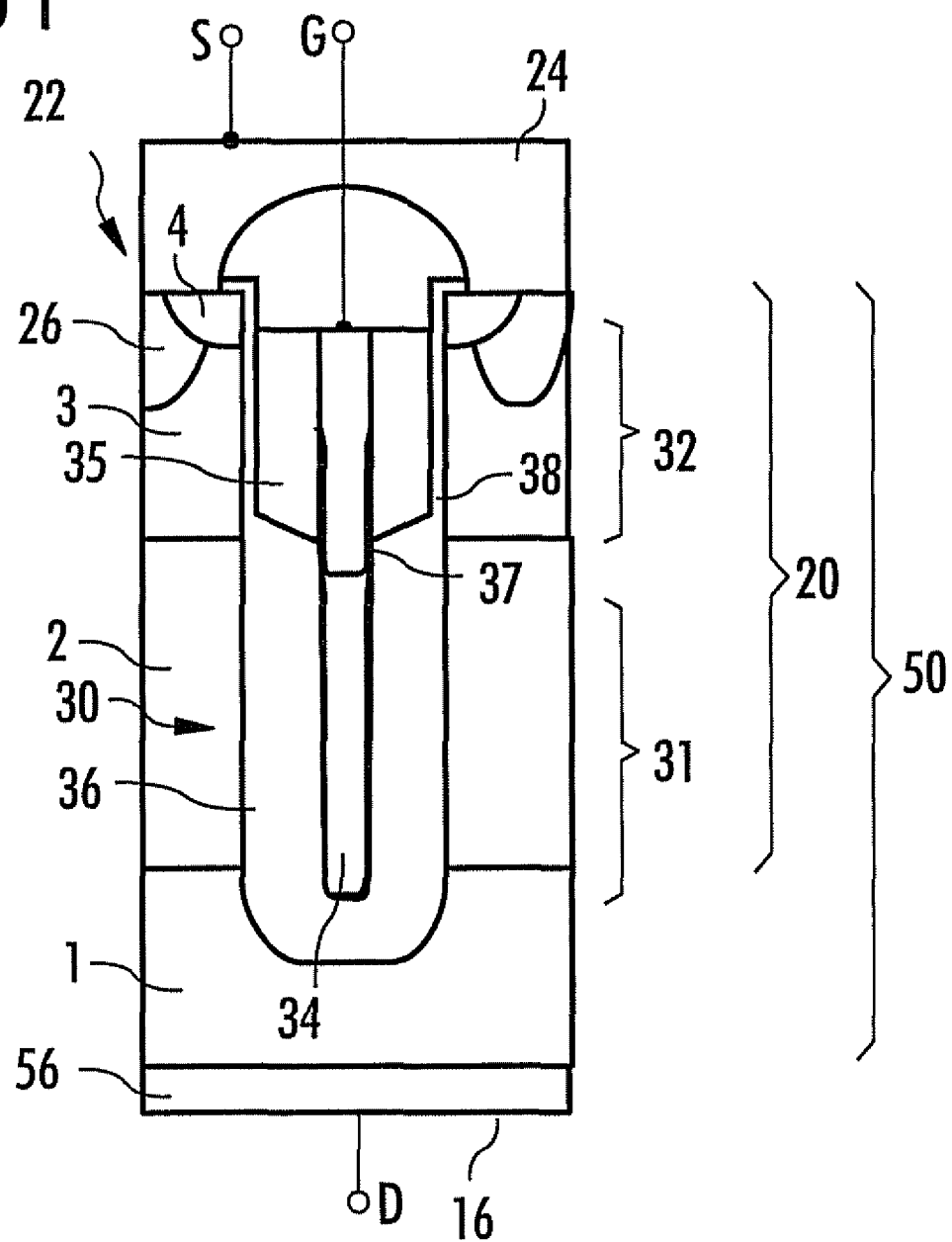

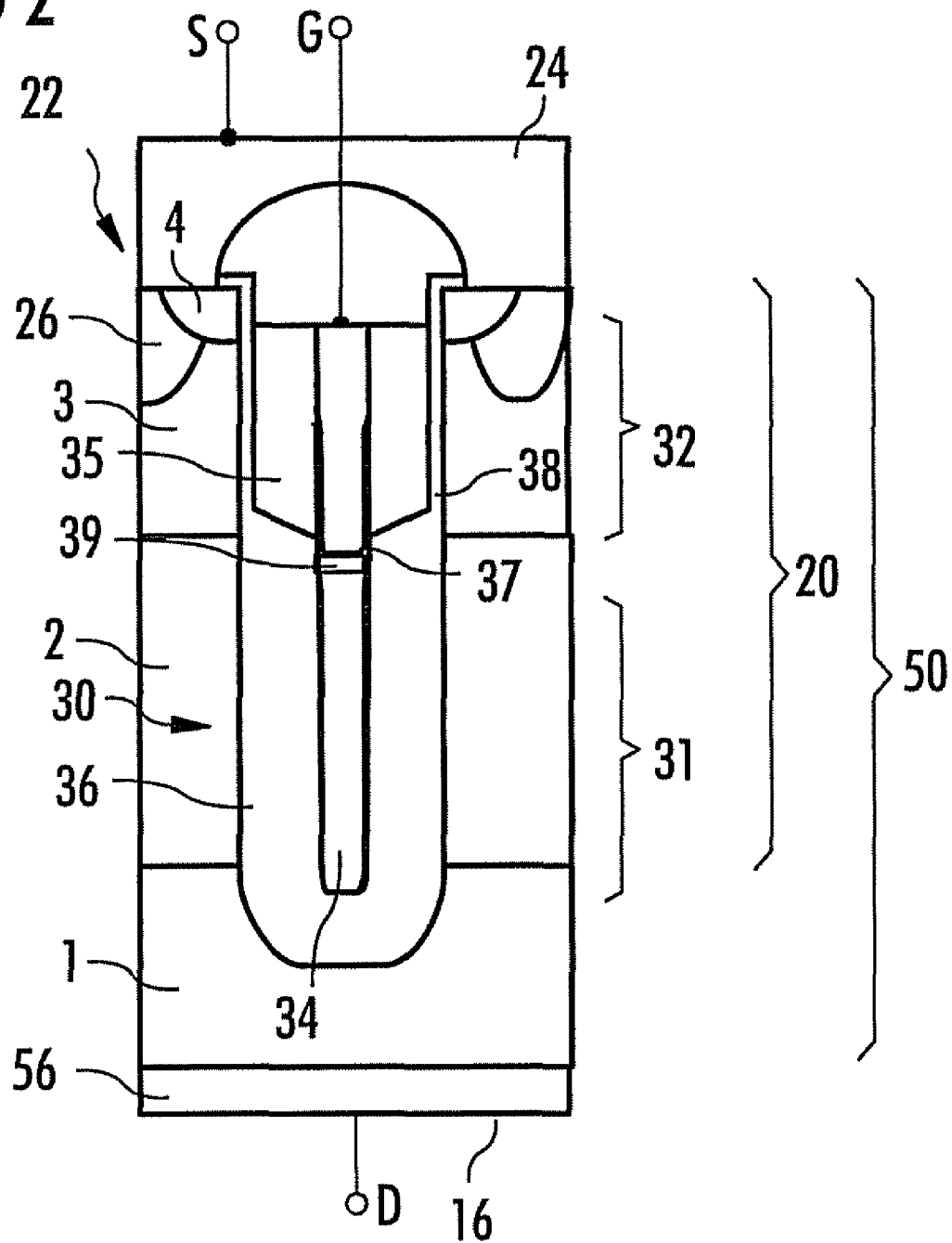

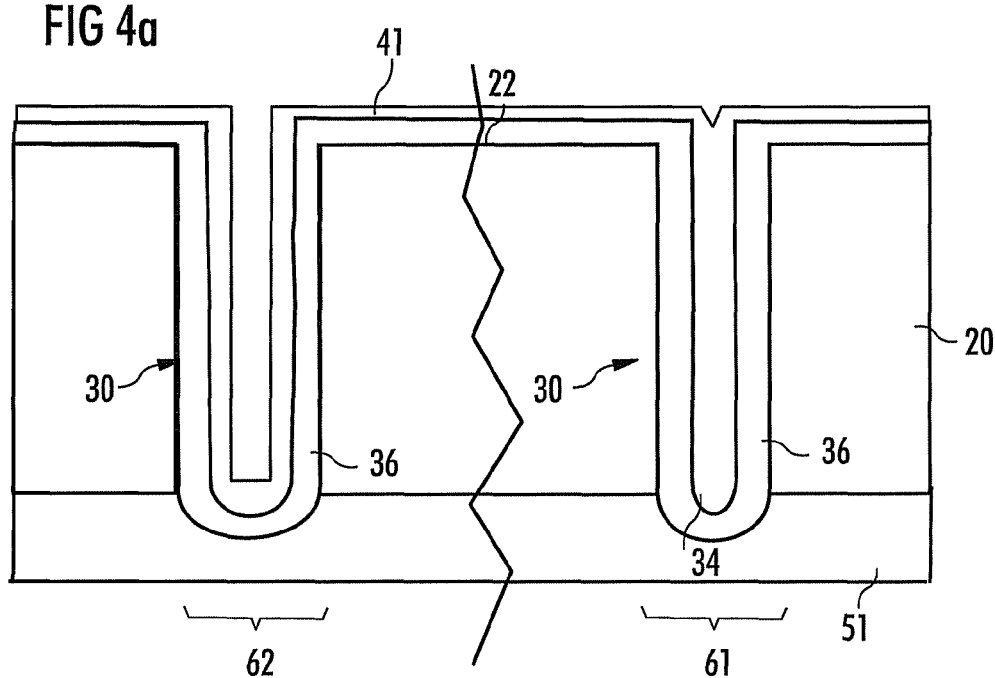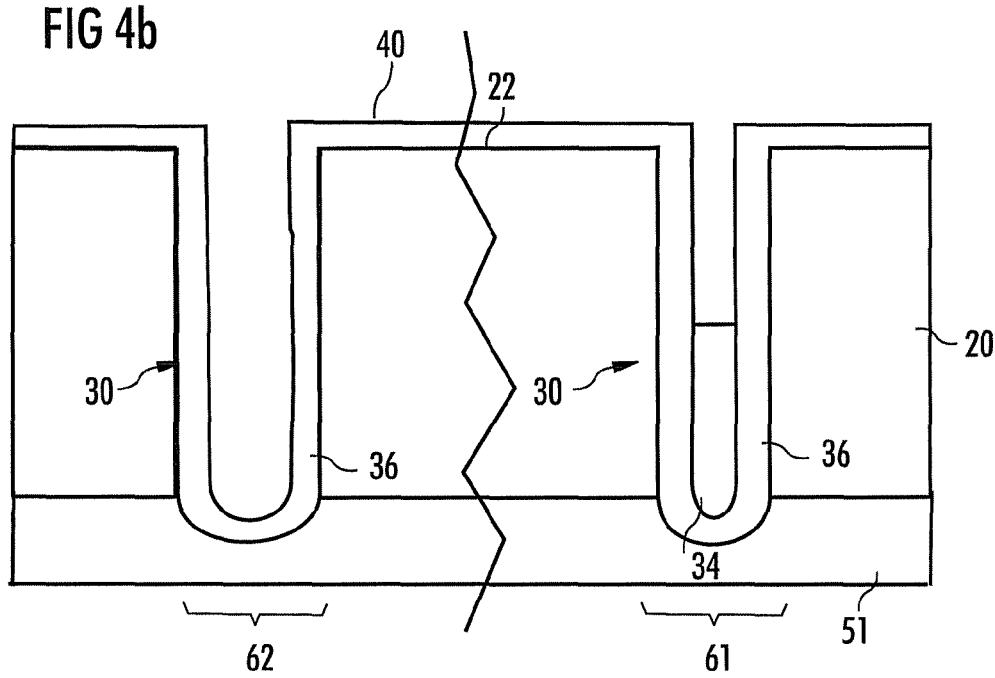

US 7,833,862 B2

SEMICONDUCTOR DEVICE AND METHOD FOR FORMING SAME

BACKGROUND

An important goal in the development of new generations of power transistors is to improve some key parameters, as for example the on resistivity $R_{on}$. As a result of this it is possible, for example, to minimize the static power loss. Furthermore, it is always desirable to improve the reliability of a power transistor.

For these and other reasons, there is a need for the present invention.

SUMMARY

One embodiment provides a semiconductor device that includes a semiconductor substrate having a trench with a sidewall isolation including a first isolating material, and a field electrode formed in lower portion of the trench. A cover including a second material is above the field electrode. The first isolating material is selectively etchable to the second material. A gate dielectric is located on the sidewall in an upper portion of the trench and a gate electrode in the upper portion of the trench.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Embodiments are depicted in the drawings and are detailed in the description which follows.

FIG. 1 illustrates a cross section of a power transistor according a first embodiment.

FIG. 2 illustrates a cross section of a power transistor according a second embodiment.

FIGS. 4a to 4d illustrates a method for manufacturing a semiconductor device according to one embodiment.

DETAILED DESCRIPTION

Figure 3A:
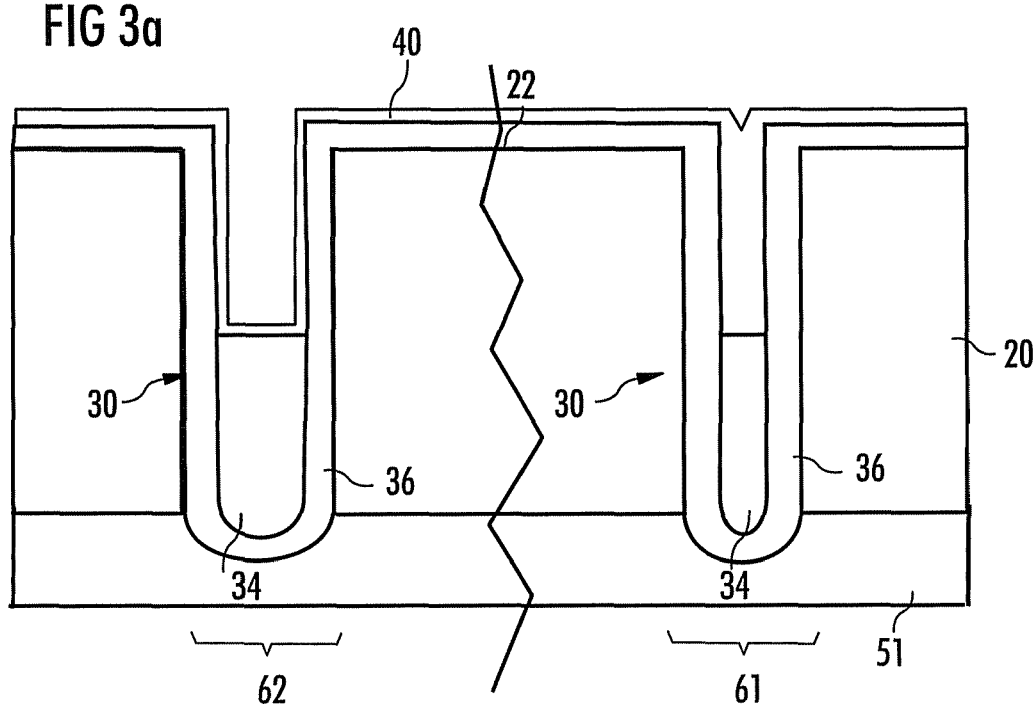
FIGS. 3a to 3d illustrates a method for manufacturing a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A number of embodiments will be explained below. In this case, identical structural features are identified by identical reference symbols in the figures. In the context of the present description, "lateral" or "lateral direction" should be understood to mean a direction or extent that runs parallel to the lateral extent of a semiconductor material or semiconductor body. A semiconductor body is typically present as a thin wafer or chip and includes two areas situated on opposite sides, one area of which is designated as main area. The lateral direction thus extends parallel to these surfaces. In contrast thereto, the term "vertical" or "vertical direction" is understood to mean a direction that runs perpendicular to the main area and thus to the lateral direction. The vertical direction therefore runs in the thickness direction of the wafer or chip.

The embodiments are described predominantly on the basis of n-channel power transistors. However, the embodiments are not restricted thereto and can also be formed as p-channel power transistors.

The structures illustrated in the figures are not depicted true to scale but rather serve only for the better understanding of the embodiments.

FIG. 1 illustrates, on the basis of a vertical field effect power transistor, a semiconductor component having a semiconductor body 50 having a first semiconductor region 1, a second semiconductor region 2 and a third semiconductor region 3. The first and second semiconductor regions 1 and 2 are of a first conduction type and n-conducting in the present case. By contrast, the third semiconductor region 3 is of a second conduction type, which is complementary to the first conduction type, and p-conducting in the present case.

In one embodiment, the semiconductor body 50 includes silicon. Other materials such as, for example, silicon carbide (SiC) or compound semiconductors are likewise suitable.

Within the semiconductor body 50 a trench 30 is provided which includes a sidewall isolation 36 including a first isolating material, silicon oxide in this example. Furthermore, a field electrode 34 is arranged in a lower portion 31 of the trench 30, the field electrode 34 being insulated from the semiconductor body 50 and the semiconductor regions formed therein by the sidewall isolation 36. Thus, in the region of the second semiconductor region 2, the sidewall isolation 36 performs the function of a field oxide. The sidewall isolation 36 may include one material or material combinations. An insulating oxide, for example, silicon oxide is typically used. However, different materials may also be used for producing sidewall isolation 36. The sidewall isolation 36 may also grow very slowly in its thickness, as seen in the vertical direction, so that the complete thickness is reached only in the region of the trench bottom.

In an upper portion 32 of the trench 30 a gate dielectric 38 next to the third semiconductor region 3 is provided. Next to the dielectric 38 the gate electrode 35 is provided, which in this example exhibits two separated wings spaced apart by a cover 37 arranged above the field electrode 34. The cover 37 includes a second material, for example silicon nitride, whereby the first isolating material of the sidewall isolation 36 being selectively etchable to the second material of the cover 37.

An $n^+$-doped fourth semiconductor region 4 is arranged in the semiconductor body 50 the fourth semiconductor region being spaced apart from the second semiconductor region 2. The fourth semiconductor region 4 is typically situated at a first surface 22 of the semiconductor body 50, reaches laterally as far as the trench structures 30 and typically forms the source region (source zone) of the power transistor.

The third semiconductor region 3 is typically referred to as body region. By contrast, the semiconductor region 2 constitutes a drift path (drift zone) between the body region 3 and the first semiconductor region 1, which is referred to as the substrate or drain region (drain zone). A channel is formed in the third semiconductor region or body region 3 when a suitable voltage is applied to the gate electrode 35.

A fifth semiconductor region 26, which is typically a highly-doped p-conducting body terminal region or a trench contact, is likewise formed at the first surface 22 of the semiconductor body 50 in the third semiconductor region 3. Body terminal region 26 and source region 4 are contact-connected by using a metalization 24 situated on the first surface 22. An associated source terminal S is illustrated in FIG. 1.

The gate electrode 35 is contact-connected via a gate terminal G. A rear side contact 56 is situated on a rear side 16 (second surface) of the semiconductor body 50 and constitutes a drain-side contact-connection connected to a drain terminal D.

The embodiments described herein exhibit several embodiments by providing a separate cover over the field electrode. The cover is formed by a process (processes) different from the process (processes) used to form the field electrode. The cover is also formed by a process (processes) different from the process (processes) used to form the gate electrode. In the embodiment illustrated in FIG. 1 a cover made from a second isolating material is provided. Thereby, the first isolating material used to form the sidewall isolation is selectively etchable to the second isolating material being used to form the cover.

The provision of the cover significantly reduces the overlap capacity between the gate electrode and the field plate which decisively contributes to the switching speed of the transistor. In addition, the required gate charge can be reduced.

In addition, the reliability of the device can be increased. The width of the trench can be reduced without risking any delamination effects, which leads to a reduced on-resistance of the final device. Furthermore, the wafer distortion can be reduced. Accordingly, thinner wafers can be produced which again leads to a reduced on-resistance of the final device.

FIG. 2 illustrates a further embodiment. Thereby, same reference numerals denote the same or similar parts as in FIG. 1. The embodiment illustrated in FIG. 2 differs from embodiment illustrated in FIG. 1 in the fact that the cover 37 now includes a conductive material. The conductive material is chosen in such a manner that the first isolating material used for sidewall isolation is selectively etchable to this conductive material. Furthermore, the embodiment illustrated in FIG. 2 exhibits an isolating layer 39 between the field electrode 34 and the cover 37 in order to isolate the cover 37 from the field electrode 34.

In FIGS. 1 and 2 the cover extends along the complete height of the gate electrode. However, a situation may also arise where the cover only overlaps with a portion of the gate electrode or where the gate electrode is located on top of the cover.

FIGS. 3a to 3d describe a method for producing a semiconductor device according to one embodiment. Firstly, provision is made of a semiconductor basic body 51 composed, for example, of highly n-doped monocrystalline silicon, which subsequently forms the first semiconductor region 1. An epitaxial layer (semiconductor layer) 20 composed of silicon, for example, is grown onto the semiconductor basic body 51. The second and third semiconductor region and also the fourth and fifth semiconductor region are subsequently formed in the epitaxial layer 20. During the deposition of the epitaxial layer 20 or by using suitable subsequent measures, a predetermined doping profile is formed in the epitaxial layer 20.

Trenches 30 are subsequently introduced into the substrate wafer (semiconductor body) by using anisotropic or isotropic etching, and a process involves for example thermal oxidation of a thick field oxide 36 in the trenches 30. This is followed by the production of the poly silicon field plate 34 in the trenches 30.

In order to provide an electrical connection between the source and the field electrode the trench along its lateral extend includes a first portion 61 where the cover above the field electrode is formed and a second portion 62 where a conductive connection to the field electrode is formed. In the example illustrated in FIGS. 3a to 3d the second portion 62 of the trench 30 is illustrated on the left side whereas the first portion 61 of the trench 30 is illustrated on the right side of the drawings. Furthermore, in the example illustrated in FIGS. 3a to 3d the first portion 61 of the trench has a first width and the second portion 62 of the trench has second width, the second width being larger than the first width.

In the following the material 40 of the cover 37 is conformal deposited on top of the field electrode. In the present example this material is silicon nitride. Due to the fact that width of trench in the second portion of the trench is larger than the width of the trench in the first portion of the trench the material of the cover does not fill out the second portion of the trench. The resulting situation is illustrated in FIG. 3a.

Figure 3B:
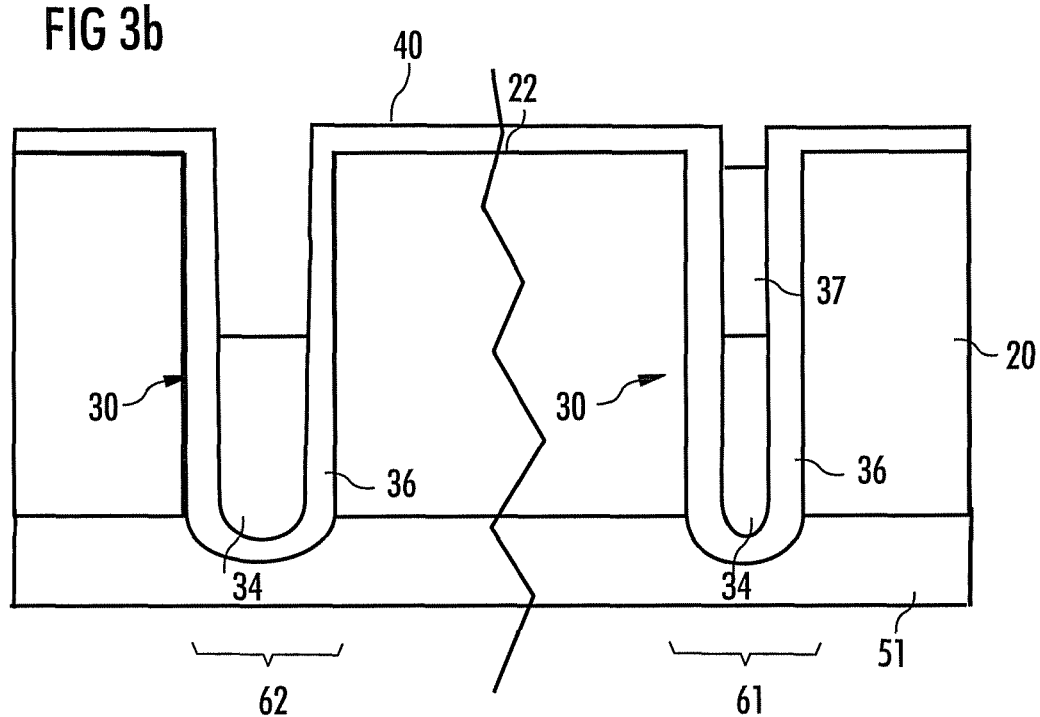

By using an isotropic etch process the silicon nitride is completely removed in the second portion of the trench whereas the cover remains on top of the field electrode in the first portion of the trench. The resulting situation is illustrated in FIG. 3b.

Figure 3C:
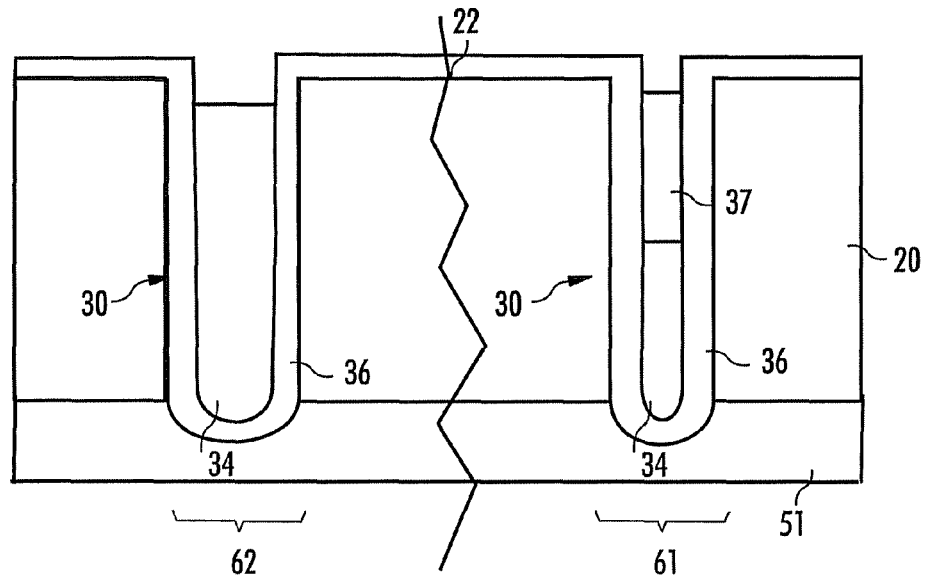

In order to provide an electrical connection between the source and the field electrode a further poly silicon deposition process is performed. Thereafter, unnecessary poly silicon is etched away by a recess process so that in the first portion of trench the additional poly silicon is completely removed. The resulting situation is illustrated in FIG. 3c.

Figure 3D:
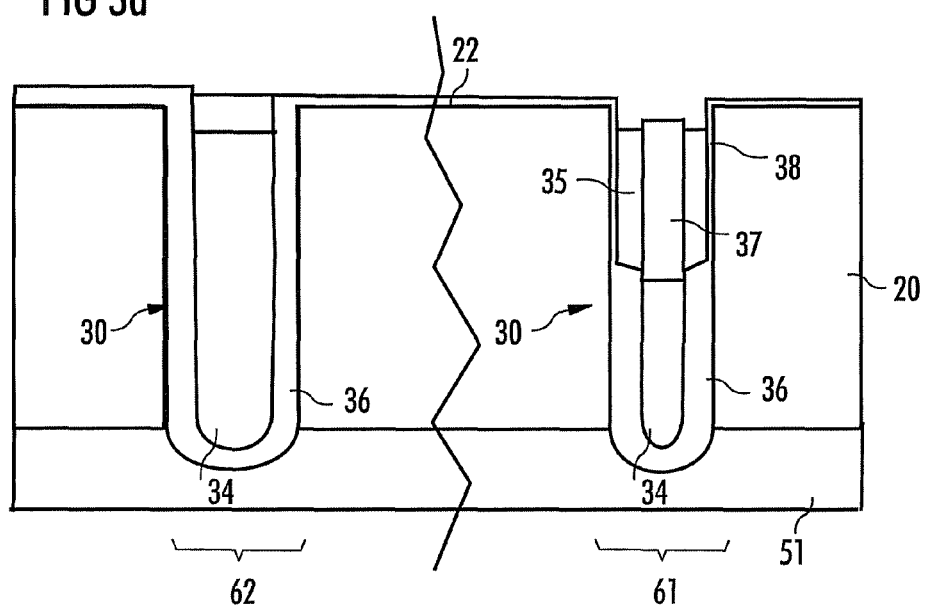

In the following the sidewall isolation in an upper portion of the trench is locally removed by etching and a gate dielectric 38 is formed on the sidewall by an oxidation process. By using a further deposition process followed by a further recess process the wings of the gate electrode 35 are formed between the gate dielectric 38 and the cover 37 in the first portion of the trench. The resulting situation is illustrated in FIG. 3d.

Thus method for manufacturing a semiconductor device is provided which includes providing a semiconductor substrate having a trench with a sidewall isolation including a first isolating material, forming a field electrode in a lower portion of the trench, forming a cover including a second material above the field electrode, the first isolating material being selectively etchable to the second material, removing the sidewall isolation in an upper portion of the trench, forming a gate dielectric on the sidewall in the upper portion of the trench and forming a gate electrode in the upper portion of the trench. In one embodiment, the processes are performed in the given sequence.

After providing the usual contacts and isolations the substrate wafer is subsequently applied by its top side 22 to a carrier (not illustrated) in a releasable manner. This serves to stabilize the substrate wafer during the subsequent mechanical grinding and etching of the rear side 16. In one embodiment the thinning of the wafer may also be achieved without the use of an additional carrier. The substrate wafer may be thinned by using a CMP method, for example, wherein the bottom of the trenches 30 may serve as a grinding stop. Typically, however, the thinning is already stopped prior to uncovering the bottom, in order that semiconductor material still remains below the trenches 30. After thinning the substrate wafer may have a thickness of between approximately 30 μm and 250 μm.

FIGS. 4a to 4d describe a method for producing a semiconductor device according to one embodiment.

Provision is made of a semiconductor basic body 51 composed, for example, of highly n-doped monocrystalline silicon, which subsequently forms the first semiconductor region 1. An epitaxial layer (semiconductor layer) 20 composed of silicon, for example, is grown onto the semiconductor basic body 51. The second and third semiconductor region and also the fourth and fifth semiconductor region are subsequently formed in the epitaxial layer 20. During the deposition of the epitaxial layer 20 or by using suitable subsequent measures, a predetermined doping profile is formed in the epitaxial layer 20.

Trenches 30 are subsequently introduced into the substrate wafer (semiconductor body) by using anisotropic etching, and a process involves for example thermal oxidation of a thick field oxide 36 in the trenches 30.

In order to provide an electrical connection between the source and the field electrode the trench along its lateral extend includes a first portion 61 where the cover above the field electrode is formed and a second portion 62 where a conductive connection to the field electrode is formed. In the example illustrated in FIGS. 4a to 4d the second portion of the trench is illustrated on the left side whereas the first portion of the trench is illustrated on the right side of the drawings. Furthermore, in the example illustrated in FIGS. 4a to 4d the first portion 61 of the trench has a first width and the second portion 62 of the trench has second width, the second width being larger than the first width.

In the following the material 41 of the field plate 34 is conformal deposited. In the present example this material is poly silicon. Due to the fact that width of trench in the second portion of the trench is larger than the width of the trench in the first portion of the trench the material of the field plate does not fill out the second portion of the trench. The resulting situation is illustrated in FIG. 4a.

By using an isotropic etch process the poly silicon is completely removed in the second portion of the trench whereas the field electrode remains in the first portion of the trench. The resulting situation is illustrated in FIG. 4b.

Figure 4C:
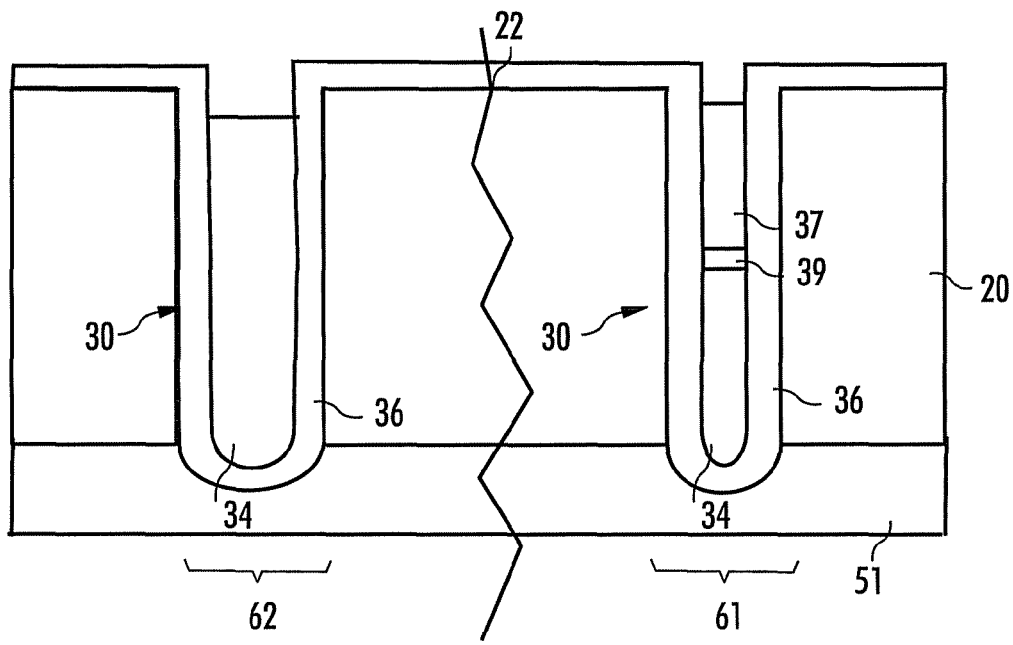

Thereafter an oxidation process is performed such that an isolation layer 39 is formed on top of the field electrode 34. In order to provide an electrical connection between the source and the field electrode a further poly silicon deposition process is performed. Thereafter, unnecessary poly silicon is etched away by a recess process so that in the first portion of trench the conductive cover 37 is formed. The resulting situation is illustrated in FIG. 4c.

Figure 4D:
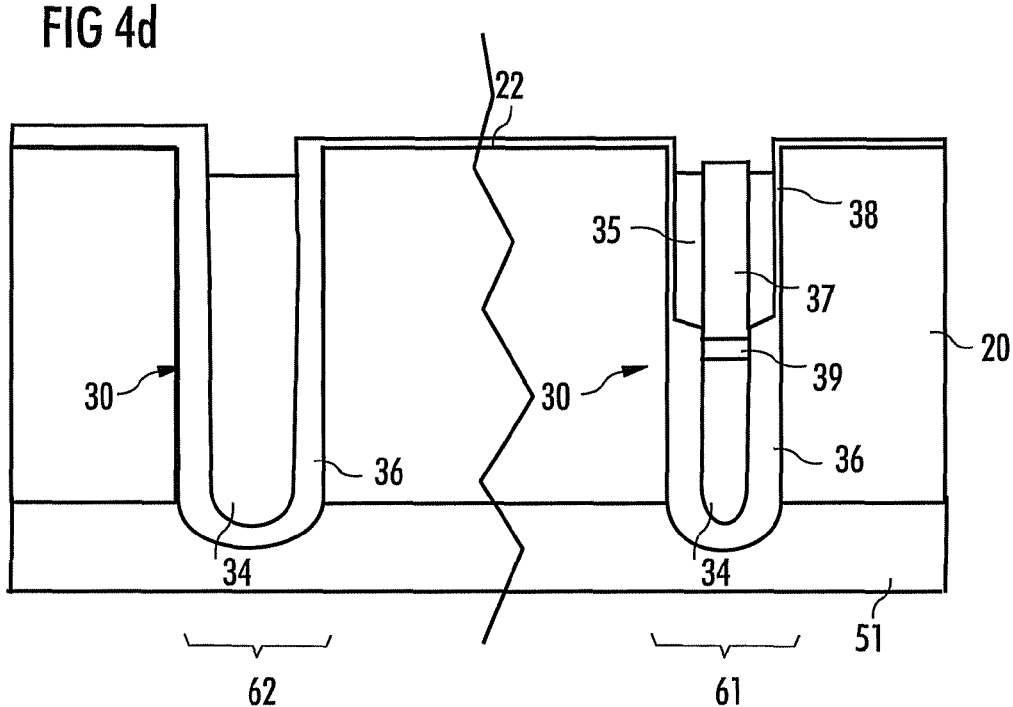

In the following the sidewall isolation 36 in an upper portion of the trench is locally removed by etching and a gate dielectric 38 is formed on the sidewall by an oxidation process. Thereby, a portion of the conductive cover 37 also becomes oxidized. However, this additional layer (not illustrated) does not perform any relevant function. By using a further deposition process followed by a further recess process the wings of the gate electrode 35 are formed between the gate dielectric 38 and the cover 37 in the first portion of the trench. The conductive cover 37 may, at later stage, be connected with the gate potential. One resulting situation is illustrated in FIG. 4d.

Both methods described above have in common that due to the widened portion of the trench an electric contact from the source to field electrode in the lower portion of the trench can be established without the need for an additional lithographic process. Layout examples of widened trenches are illustrated in FIGS. 5 and 6.

Figure 5:
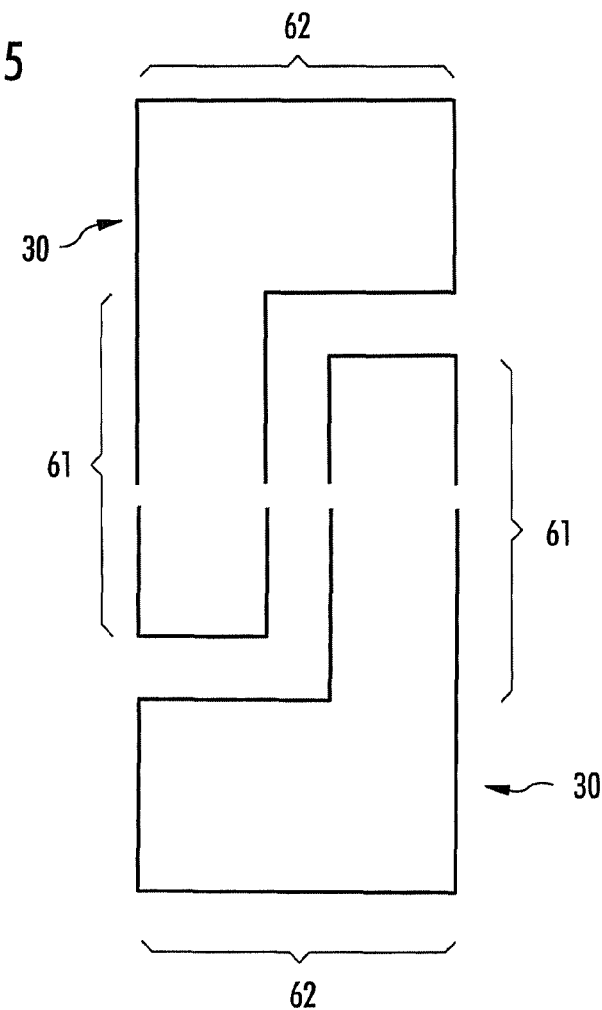
FIG. 5 illustrates a trench layout as used in the present description.

In FIG. 5 the first portion 61 of the trench is shortened in the layout so that place arises for the second portion 62 of an adjacent trench to be used for contacting the field electrode. Thereby, a widened portion of the trench is achieved without changing the distance between adjacent trenches. Using this layout variant only a single-sided connection to the field electrode is used.

Figure 6:
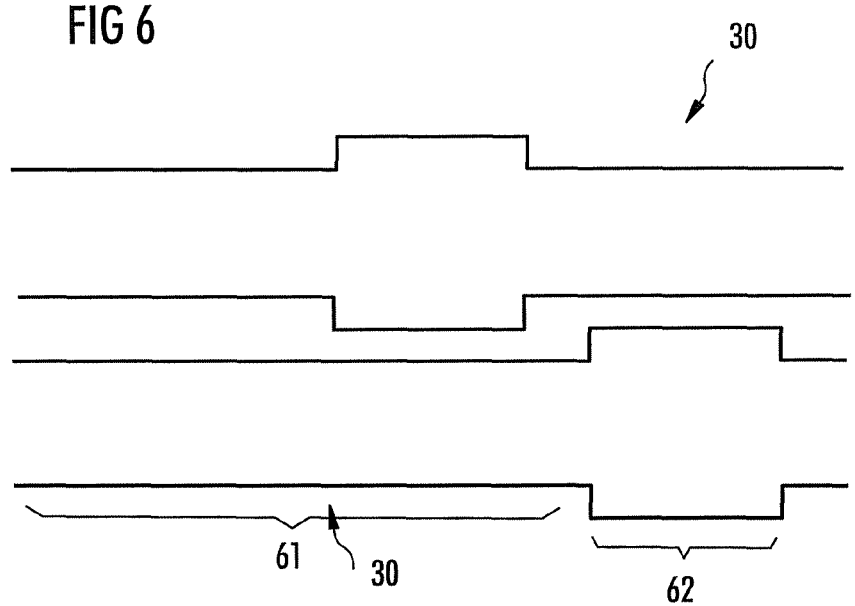
FIG. 6 illustrates a further trench layout as used in the present description.

A further layout example at using widened portions of the trench is represented in FIG. 6. The widened portion 62 of the trench is hereby located at an appropriate position along the lateral extension of trench. In this layout example the distance between adjacent trenches is reduced by an amount that correspond to the half of the increase of the width of the trench at the widened portion 62.

Figure 7A:
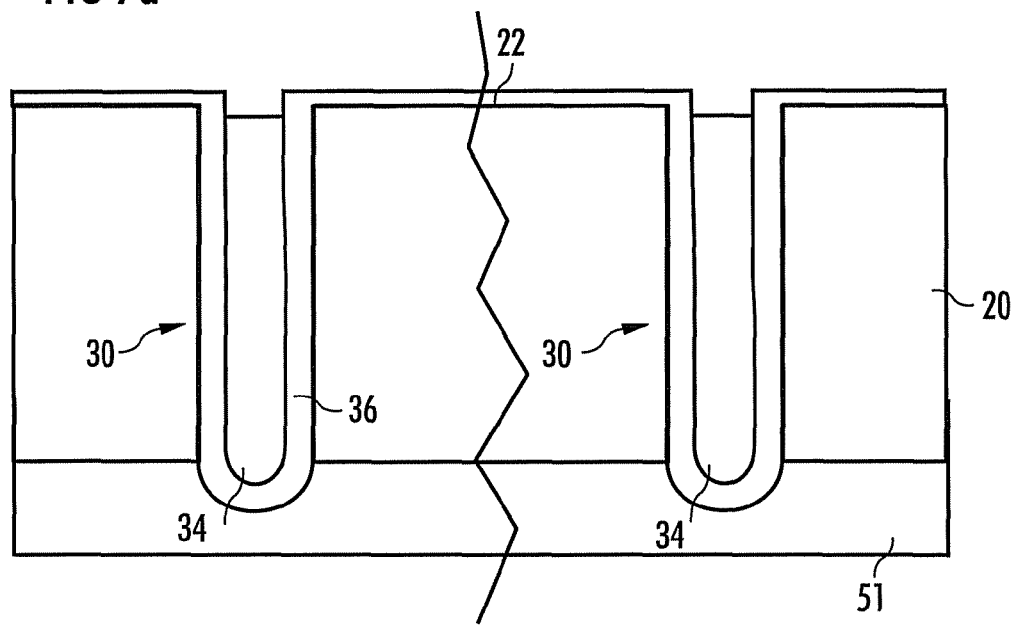
FIGS. 7a to 7c illustrates a method for manufacturing a semiconductor device according to one embodiment.
Figure 7B:
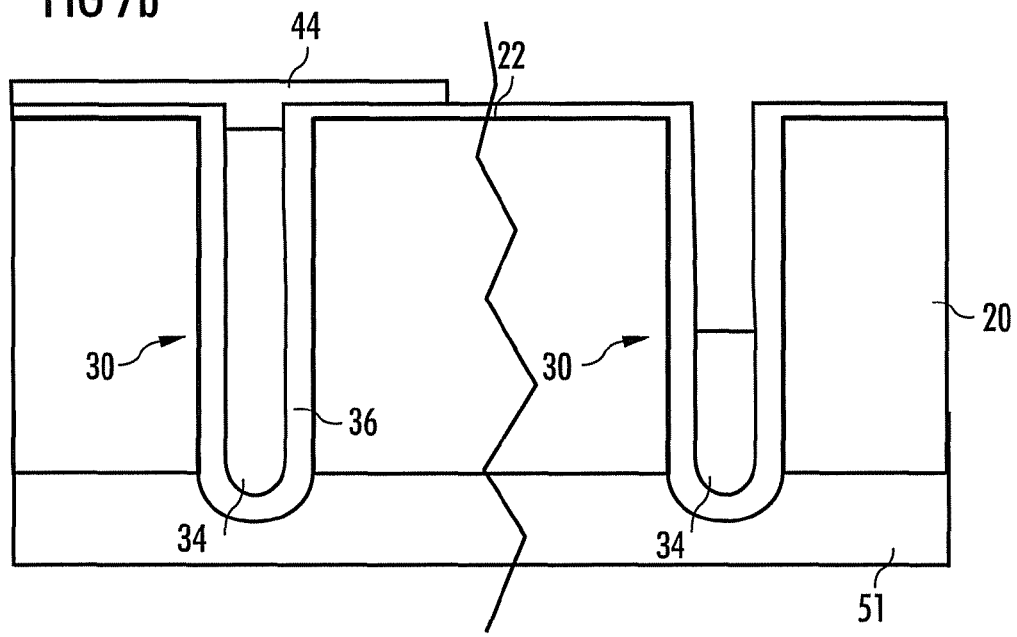
Figure 7C:
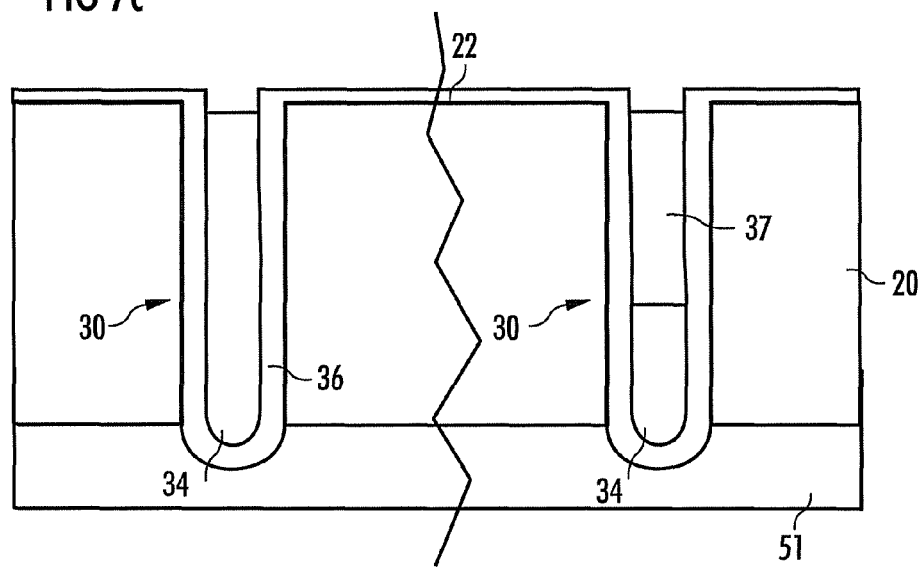

FIGS. 7a to 7c describe a method for producing a semiconductor device according to one embodiment. By using an additional lithographic process it is possible to form the connection from the source to the field electrode while a constant width of trench over the complete chip can be maintained.

As a starting point the method uses a situation similar to the situation as described with regard to FIG. 4a. However, in contrast to the situation described with regard to FIG. 4a the trenches illustrated in FIG. 7a now have the same width. After the sidewall isolation 36 has been produced the material of the field electrodes 34, poly silicon in the present example, is deposited to fill out the trenches. This deposition process may be followed by an additional crystallisation process. Thereafter, a recess process is performed, in order to remove the poly silicon located outside the trenches 30. The resulting situation is illustrated in FIG. 7a.

Thereafter a resist mask 44 covering the left trench is produced by using a lithographic process. This resist mask 44 is then used during a recess process to remove an upper portion of the poly silicon located in the trench on the right side. The resulting situation is illustrated in FIG. 7b.

After removing the resist mask 44 the material of the cover 37 is deposited. In the present example this material is silicon nitride. A further recess process is performed to remove the silicon nitride that is located outside the trench. The resulting situation is illustrated in FIG. 7c. The situation illustrated in FIG. 7c basically corresponds to the situation illustrated in previously described FIG. 3c. Accordingly, similar processes as described with regard to FIG. 3d may now follow in order to produce the gate dielectric and the gate electrodes.

As an alternative to the silicon nitride deposition an oxidation and a poly silicon deposition followed by poly silicon recess can also be performed. Thereby, an embodiment as described with regard to FIG. 2 using a conductive cover 37 can be produced.

The process described with regard to FIGS. 7a to 7c uses three recess processes in order to produce the cover over field electrode in a first portion of the trench and a conductive connection to the field electrode in a second portion of the trench. However, by using an etch process that etches both silicon nitride and poly silicon and by adjusting the etch selectivity so that poly silicon is etched considerably faster than the silicon nitride, a method with only two recess processes can be realized. This is represented in the following FIGS. 8a to 8c.

Figure 8A:
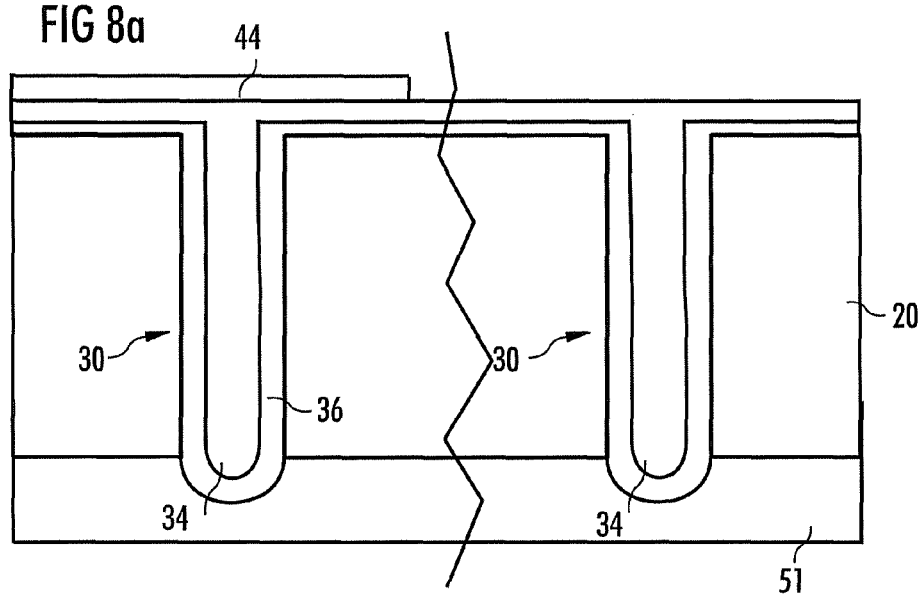
FIGS. 8a to 8c illustrates a method for manufacturing a semiconductor device according to one embodiment.

As a starting point the method uses again a situation similar to situation as described with regard to FIG. 4a. However, in contrast to the situation described with regard to FIG. 4a the trenches illustrated in FIG. 8a now have the same width. After the sidewall isolation has been produced the material of the field electrodes, poly silicon in the present example, is deposited to fill out the trenches. This deposition process may be followed by an additional crystallisation process. Thereafter a resist mask 44 covering the left trench is produced on top of the poly silicon by using a lithographic process. The resulting situation is illustrated in FIG. 8a.

Figure 8B:
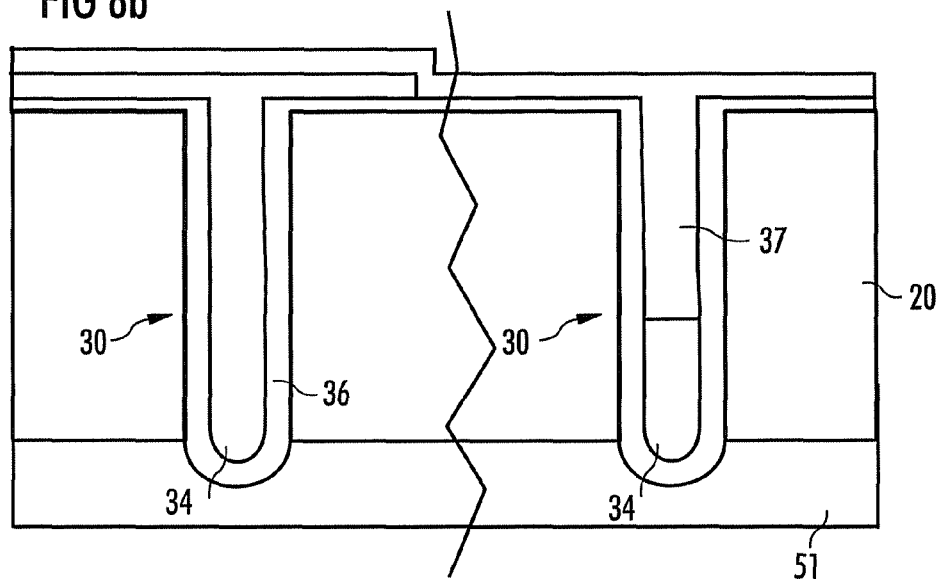

This resist mask is then used during a recess process to remove an upper portion of the poly silicon located in the trench on the right side. After removing the resist mask the material of the cover is deposited. In the present example this material is silicon nitride. The resulting situation is illustrated in FIG. 8b.

Figure 8C:
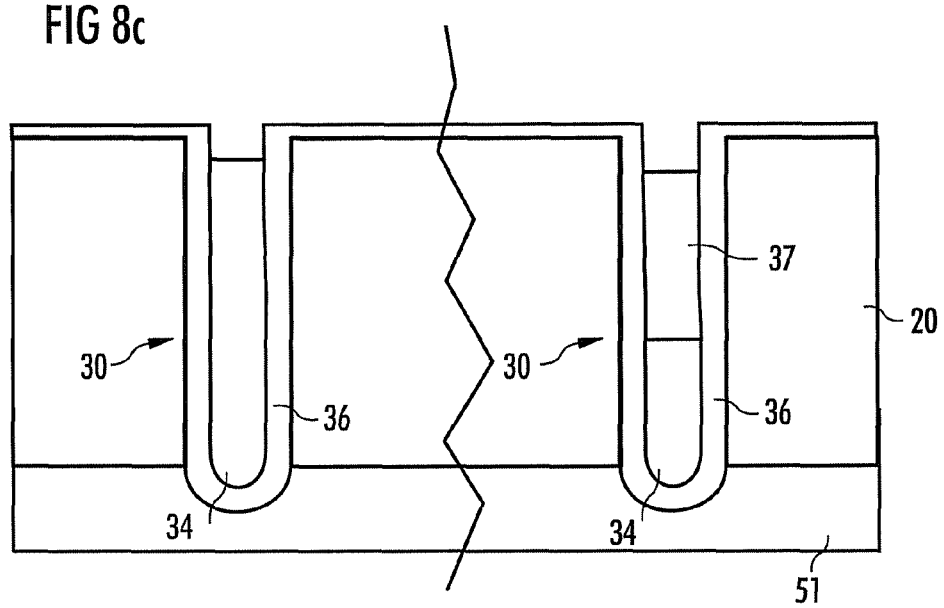

A further recess process is performed to remove the silicon nitride located outside the trench and the remaining poly silicon that is located outside the trench. Thereby, the etch selectivity is adjusted so that poly silicon is etched considerably faster than the silicon nitride. The resulting situation is illustrated in FIG. 8c. The situation illustrated in FIG. 8c basically corresponds to the situation illustrated in previously described FIG. 3c. Accordingly, similar processes as described with regard to FIGS. 3d and 3e may now follow in order to produce the gate dielectric and the gate electrodes.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor device, comprising:
    providing a semiconductor substrate having a trench with a sidewall isolation comprising a first isolating material;
    forming a field electrode in a lower portion of the trench;
    forming a cover comprising a second material above the field electrode, the first isolating material being selectively etchable to the second material;
    removing the sidewall isolation in an upper portion of the trench;
    forming a gate dielectric on the sidewall in the upper portion of the trench, wherein a remaining portion of the sidewall isolation in the lower portion of the trench serves as a field oxide and has a thickness greater than that of the gate dielectric; and
    forming a gate electrode in the upper portion of the trench.

2. The method of claim 1, wherein the second material is an isolating material.

3. The method of claim 2, wherein the second material is silicon nitride.

4. The method of claim 1, wherein the second material is a conductive or semi conductive material.

5. The method of claim 4, wherein the second material is polysilicon.

6. The method of claim 4, wherein the cover comprises an isolating layer which is formed on top of the field electrode before the second material is deposited.

7. The method of claim 1, wherein the process of forming the cover comprises the process of conformal depositing the second material.

8. The method of claim 1, wherein the process of forming the field electrode comprises the process of conformal depositing the material of the field electrode.

9. The method of claim 1, wherein the process of removing the sidewall isolation comprises process of etching the first isolating material selectively to the second material.

10. A method for manufacturing a semiconductor device, comprising:
    providing a semiconductor substrate having a trench with a sidewall isolation comprising a first isolating material;
    forming a field electrode in a lower portion of the trench;
    forming a cover comprising a second material above the field electrode, the first isolating material being selectively etchable to the second material;
    removing the sidewall isolation in an upper portion of the trench;
    forming a gate dielectric on the sidewall in the upper portion of the trench, wherein a remaining portion of the sidewall isolation in the lower portion of the trench serves as a field oxide and has a thickness greater than that of the gate dielectric; and
    forming a gate electrode in the upper portion of the trench, including defining the trench along its lateral extend to comprise a first portion where the cover above the field electrode is formed and a second portion where a conductive connection to the field electrode is formed.

11. The method of claim 10, wherein the first portion of the trench has a first width and the second portion of the trench has second width, the second width being larger than the first width.

12. The method of claim 10, wherein the process of forming the cover comprises the process of selectively covering the second portion of the trench with a mask material and removing the material of the field electrode from an upper portion of the trench.

* * * * *